United States Patent

Trivedi et al.

(10) Patent No.: US 6,737,844 B2
(45) Date of Patent: May 18, 2004

(54) DYNAMIC MODULATION OF ON-CHIP SUPPLY VOLTAGE FOR LOW-POWER DESIGN

(75) Inventors: Pradeep Trivedi, Sunnyvale, CA (US); Sudhakar Bobba, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 59 days.

(21) Appl. No.: 10/156,583

(22) Filed: May 28, 2002

(65) Prior Publication Data

US 2003/0223301 A1 Dec. 4, 2003

(51) Int. Cl.[7] .............................. G05F 1/565
(52) U.S. Cl. ........................ 323/283; 341/155
(58) Field of Search .................. 341/155; 323/283, 323/284

(56) References Cited

U.S. PATENT DOCUMENTS

| | | | | |
|---|---|---|---|---|
| 3,153,142 A | * | 10/1964 | Hellerman | 341/165 |
| 5,774,734 A | * | 6/1998 | Kikinis et al. | 713/300 |
| 6,292,902 B1 | * | 9/2001 | Drobnik | 713/320 |
| 6,639,391 B2 | * | 10/2003 | Huang et al. | 323/284 |
| 2002/0000928 A1 | * | 1/2002 | Heyl et al. | 341/155 |
| 2002/0118001 A1 | * | 8/2002 | Duffy et al. | 323/283 |

FOREIGN PATENT DOCUMENTS

DE 10035418 A1 * 2/2002 .............. G05F/1/44

* cited by examiner

Primary Examiner—Howard I Williams
(74) Attorney, Agent, or Firm—Osha Novak & May L.L.P.

(57) ABSTRACT

A modulation circuit arranged to modulate a first voltage from a first power supply grid to produce a desired second voltage not greater than the first voltage on a second power supply grid is provided. A digital register is operatively connected to the modulation circuit to determine the desired second voltage on the second power supply grid. Furthermore, the digital register maintains a value representative of an activity level or an anticipated activity level of a circuit connected to the second power supply grid. The modulation circuit maintains the desired second voltage for the circuit connected to the second power supply grid by transferring charge between capacitances.

23 Claims, 4 Drawing Sheets

DYNAMIC MODULATION OF ON-CHIP SUPPLY VOLTAGE FOR LOW-POWER DESIGN

BACKGROUND OF INVENTION

Modern high performance microprocessors have an ever-increasing number of circuit elements and an ever-rising clock frequency. Also, as the number of circuits that can be used in a central processing unit (CPU) has increased, the number of parallel operations has risen. As CPU performance continues to increase, the result has been a larger number of circuits switching at faster rates.

Higher frequencies and data throughput cause a processor to consume increased power. The power dissipated by a circuit is a quadratic function of the supply voltage. Reducing the supply voltage may decrease the power dissipated by a circuit; however, reducing the supply voltage also increases the delay of the circuit. Slowing the speed of the circuit may cause some CPU activities to be incomplete at the end of a cycle. The effect may lead to loss of data in a CPU or incorrect results. Thus, from a design perspective, power is an important consideration. Power is a consideration in the design of a broad range of integrated circuits, including CPUs.

In FIG. 1, an integrated circuit (100) is shown with connections to an external supply voltage terminal (101) and external ground voltage terminal (103). The external supply voltage terminal (101) and external ground voltage terminal (103) are used to provide power to the integrated circuit (100). A circuit (120) located on the integrated circuit (100) performs some function necessary for the operation of the integrated circuit (100).

A supply voltage routing line (105) and a ground voltage routing line (107) are used to provide power to the circuit (120) by connecting to the external supply voltage terminal (101) and external ground voltage terminal (103), respectively. Routing lines have a resistance and form capacitances with adjacent routing lines. These parasitics created by the supply voltage routing line (105) are modeled by impedance $Z_A$ (122). The parasitics created by the ground voltage routing line (107) are modeled by impedance $Z_B$ (124).

Due to switching noise created by the active switching of circuits, e.g., circuit (120) on the integrated circuit (100), decoupling capacitors are added to act as local power supplies. For example, a decoupling capacitor (102) is located physically close to the external supply voltage terminal (101) and external ground voltage terminal (103) to reduce the amount of power supply noise. Power supply noise from the external supply voltage terminal (101) and external ground voltage terminal (103) may be generated by other integrated circuits connected to the external supply voltage terminal (101) and external ground voltage terminal (103).

In FIG. 1, decoupling capacitor (108) is located physically close to the circuit (120) to reduce the amount of power supply noise on the supply voltage routing line (105) and ground voltage routing line (107). The power supply noise on the supply voltage routing line (105) and ground voltage routing line (107) may be generated by active circuits, e.g., circuit (120), located on the integrated circuit (100).

The power dissipated by a circuit, for example circuit (120), is a quadratic function of a voltage difference, e.g., the voltage difference between the voltage on the supply voltage routing line (105) and the voltage on the ground voltage routing line (107). In particular, power is equal to the capacitance of the load multiplied by the frequency of switching multiplied by the square of the voltage difference. That is, $P = C_L f V_{DD}^2$, where P is power, $C_L$ is the capacitance of the load, and $V_{DD}$ is the voltage difference. Reducing the voltage difference may reduce the power dissipated; however, reducing the voltage difference also increases the delay of a circuit, such as the circuit (120) in FIG. 1.

SUMMARY OF INVENTION

According to one aspect of the present invention, an integrated circuit comprises a first power supply grid; a modulation circuit arranged to receive a first voltage from the first power supply grid where the first voltage is modulated by the modulation circuit to produce a second voltage not greater than the first voltage on a second power supply grid; and a digital register operatively connected to the modulation circuit where the digital register determines a desired second voltage of a circuit connected to the second power supply grid and controls the modulation of the modulation circuit.

According to one aspect of the present invention, a method of supplying power to an integrated circuit comprises modulating a first voltage from a first power supply grid to produce a second voltage not greater than the first voltage on a second power supply grid; determining a desired second voltage on the second power supply grid based on an activity level of a circuit connected to the second power supply grid; maintaining a digital value representative of the desired second voltage on the second power supply grid; and adjusting the desired second voltage based on the digital value.

According to one aspect of the present invention, an integrated circuit, comprises means for modulating a first voltage from a first power supply grid to produce a second voltage not greater than the first voltage on a second power supply grid; means for determining a desired second voltage on the second power supply grid based on an activity level of a circuit connected to the second power supply grid; means for maintaining a digital value representative of the activity level of the circuit connected to the second power supply grid; and means for adjusting the desired second voltage based on the digital value.

Other aspects and advantages of the invention will be apparent from the following description and the appended claims.

DETAILED DESCRIPTION

Figure 1:
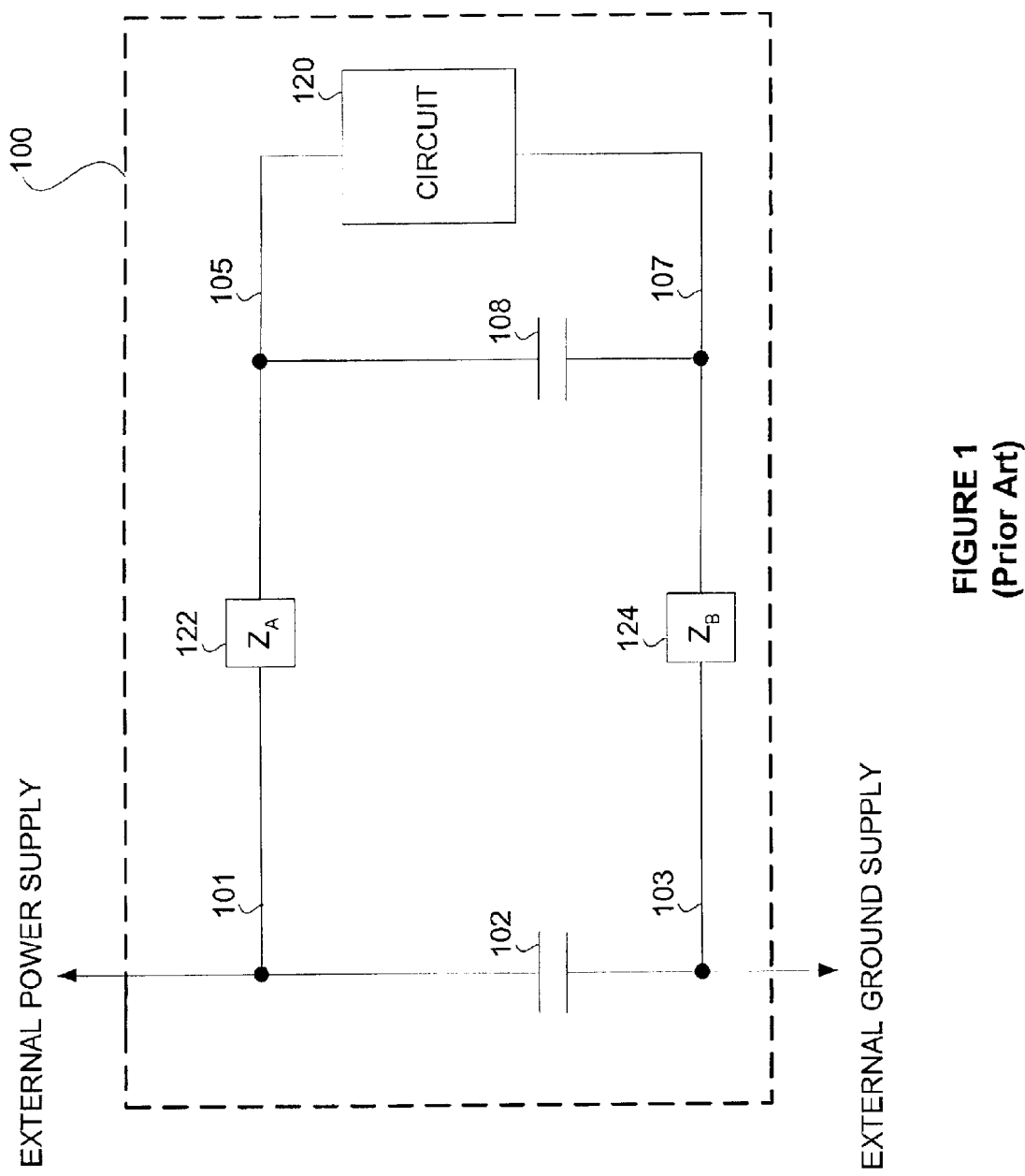
FIG. 1 shows a prior art depiction of an integrated circuit.

Exemplary embodiments of the invention will be described with reference to the accompanying drawings. Like elements in the various figures are denoted by like reference numerals for consistency.

Embodiments of the present invention relate to a modulation circuit arranged to modulate a first voltage from a first power supply grid to produce a desired second voltage not greater than the first voltage on a second power supply grid. A digital register is operatively connected to the modulation circuit to determine the desired second voltage on the second power supply grid. Furthermore, the digital register maintains a value representative of an activity level or an anticipated activity level of a circuit connected to the second power supply grid. The modulation circuit maintains the desired second voltage for the circuit connected to the second power supply grid by selectively transferring charge between capacitances.

Figure 2:
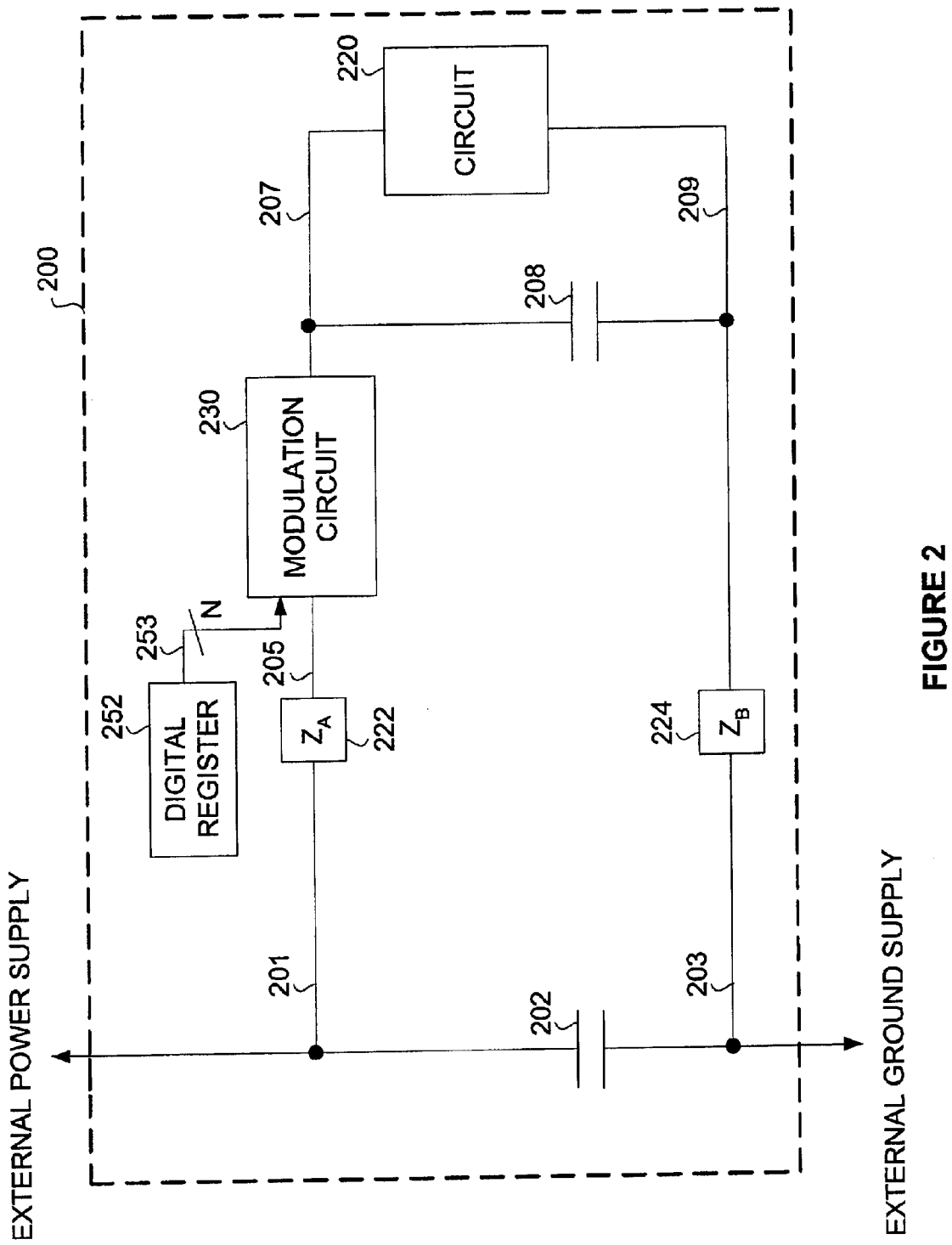
FIG. 2 shows a block diagram of a modulation circuit in accordance with an embodiment of the present invention.

FIG. 2 shows an exemplary integrated circuit (200) in accordance with an embodiment of the present invention. The integrated circuit (200) is shown with connections to an external supply voltage terminal (201) and an external ground voltage terminal (203). The external supply voltage terminal (201) and external ground voltage terminal (203) are used to provide power to the integrated circuit (200). To help minimize power supply noise, decoupling capacitance is added to act as local power supplies. For example, a decoupling capacitor (202) is positioned close to the external supply voltage terminal (201) and external ground voltage terminal (203).

Using routing lines, the external supply voltage terminal (201) and the external ground voltage terminal (203) are used to provide power to circuits located on the integrated circuit (200). The routing lines have inherent parasitics that create an impedance. For example, the external supply voltage terminal (201) connects to a supply voltage routing line (205) to provide a first voltage. The parasitics created by the supply voltage routing line (205) are modeled by impedance $Z_A$ (222). The external ground voltage terminal (203) connects to a ground voltage routing line (209). The parasitics created by the ground voltage routing line (209) are modeled by impedance $Z_B$ (224).

For purposes of the discussion with reference to FIG. 2, the external supply voltage terminal (201), external ground voltage terminal (203), decoupling capacitor (202), impedance $Z_A$ (222), impedance $Z_B$ (224), and supply voltage routing line (205) form a first power supply grid. Those with ordinary skill in the art will appreciate that the first power supply grid may have numerous routing lines, inherent parasitics and added components not specifically detailed by this example.

In FIG. 2, a circuit (220) located on the integrated circuit (200) performs some function necessary for the operation of the integrated circuit (200). The circuit (220) connects to supply voltage routing line (207) and ground voltage routing line (209). The supply voltage routing line (207) and ground voltage routing line (209) are used to provide power to the circuit (220). A decoupling capacitor (208) is located physically close to the circuit (220) to reduce the amount of power supply noise on the supply voltage routing line (207) and ground voltage routing line (209). The power supply noise on the supply voltage routing line (207) and ground voltage routing line (209) may be generated by active circuits, e.g., circuit (220), located on the integrated circuit (200).

For purposes of the discussion with reference to FIG. 2, the supply voltage routing line (207), ground voltage routing line (209), and decoupling capacitor (208) form a second power supply grid. Those with ordinary skill in the art will appreciate that the second power supply grid may have numerous routing lines, inherent parasitics and added components not specifically detailed by this example.

The supply voltage routing line (207) is connected to a modulation circuit (230) to provide a second voltage. The second power supply grid is floating, and has a second voltage that may be dynamically adjusted based on the activity level of circuit (220). A digital register (252) operatively connects to the modulation circuit (230) through N signal lines (253). The digital register (252) maintains a value representative of a desired voltage on the supply voltage routing line (207). In response to the value in the digital register (252), the modulation circuit (230) adjusts the voltage on the supply voltage routing line (207) on the second power supply grid.

The second power supply grid is designed to be isolated, i.e., floating, from the first power supply grid. In particular, supply voltage routing line (207) is isolated from the supply voltage routing line (205). The ground supply routing line (209) is connected to the external ground voltage terminal (203). A charge reservoir is created by decoupling capacitor (202). Charge is transferred from the charge reservoir and supplied to the floating second power supply grid as needed. The second voltage on the floating second power supply grid is stabilized by additional decoupling capacitance (208).

The floating second power supply grid arrangement provides a means to rapidly change the supply voltage to the circuit (220). The frequency of a clock signal (not shown) that gates the speed of activity in the circuit (220) may be adjusted. One approach may change the frequency output of a phase locked loop that supplies the clock signal. Another approach may be to gate the clock so that the circuit (220) is running at a nominal clock rate or in a stand-by mode. By reducing or stopping the clock to circuit (220), the activity level of the circuit (220), instantaneously and on average, is reduced.

In order to reduce the second voltage for the second power supply grid, the frequency of charge transfer from the first power supply grid may be reduced or stopped by the modulation circuit (230). Continued activity by the circuit (220), with a reduced or stopped charge transfer by modulation circuit (230), may reduce the second voltage for the second power supply grid.

Alternately, in order to raise and/or maintain the second voltage for the second power supply grid, charge is transferred from the first power supply grid to the second power supply grid as needed. The frequency of charge transfer may be modulated by the modulation circuit (230) to correspond with the desired second voltage on the second power supply grid.

The modulation circuit (230) may change the charge transfer from the first power supply grid to the second power supply grid by adjusting the duty cycle and/or the frequency of the charge transfer. The frequency of charge transfer refers to how often a transfer occurs, while the duty cycle refers to how much charge is transferred during each charge transfer. The modulation circuit (230) adjusts the frequency and/or duty cycle of the charge transfer in response to the digital register (252). The digital register (252) may maintain a value representative of the desired second voltage for the second power supply grid. The desired second voltage may be indicative of the activity level of the circuit (220). The activity level of the circuit (220) may be determined by the present activity level or the anticipated activity level that may occur in the future. Accordingly, the contents of the digital register (252) may change prior to a change in the activity level of the circuit (220).

The second voltage on the second power supply grid is a result of charge transfer from the decoupling capacitor (202) in the first power supply grid to the decoupling capacitor (208) in the second power supply grid. Accordingly, a continuous DC current is not required to operate. The modulation circuit (230) may stop the charge transfer from the first power supply grid to the second power supply grid in an effort to reduce the second voltage for the second power supply grid. The circuit (220) may use part of the charge stored in the decoupling capacitor (208) in the second power supply grid. Accordingly, a reduction of the second voltage occurs.

The charge stored in a capacitor is equal to the capacitance multiplied by the voltage. In accordance with an embodiment of the present invention, the first voltage may be greater than the second voltage. The capacitance (202) in the first power supply grid is not required to be greater than the capacitance (208) in the second power supply grid to supply a sufficient amount of charge to the second power supply. A first voltage that is greater than the second voltage allows a correspondingly smaller capacitance (202) to maintain an adequate stored charge.

Charge transfer is proportional to a voltage difference divided by the resistance of the path. In accordance with an embodiment of the present invention, the first voltage may be greater than the second voltage. Charge stored in the decoupling capacitor (202) in the first power supply grid may be quickly transferred to the decoupling capacitor (208) in the second power supply grid.

In accordance with an embodiment of the present invention, the circuit (220) may reside on the same integrated circuit as the first and second power supply grids and the modulation circuit.

Power is equal to the load capacitance multiplied by the switching frequency multiplied by the square of the supply voltage ($P = C_L f V_{DD}^2$). Reducing the supply voltage may decrease the power dissipated by a circuit. Reducing the supply voltage also increases the time required for the circuit to perform functions. Thus, a reduction in power may be desirable when the circuit does not have a high activity level. Dynamically adjusting the voltage supplied to the circuit to increase during times of a high activity level and decrease the voltage during times of a reduced activity level may reduce the total power dissipated by an integrated circuit.

Figure 3:
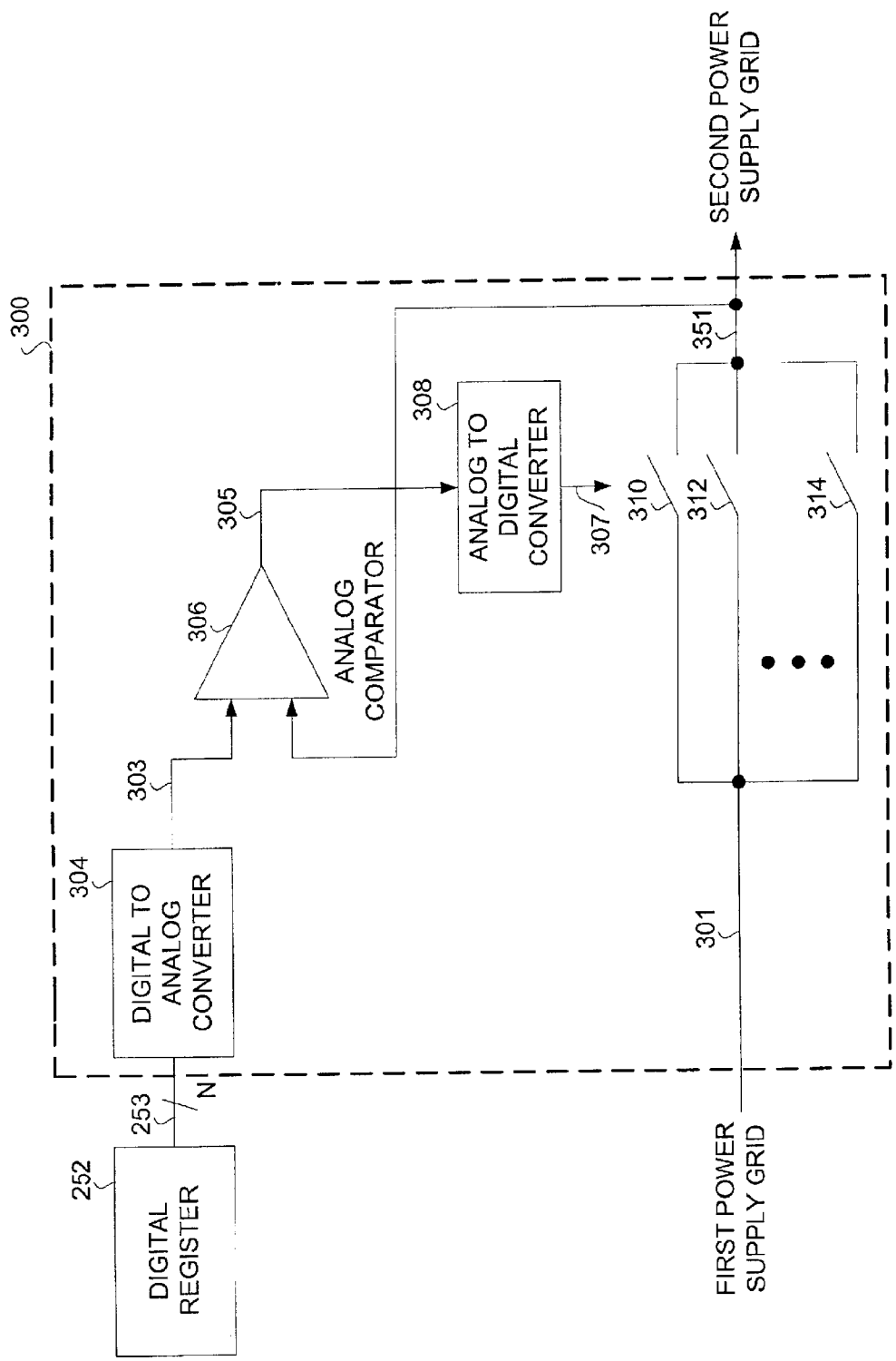
FIG. 3 shows a schematic of the modulation circuit in accordance with an embodiment of the present invention.

FIG. 3 shows a schematic of an exemplary modulation circuit (300) in accordance with an embodiment of the present invention. Modulation circuit (300) may be representative of the modulation circuit (230) in FIG. 2. A first power supply grid (301) is connected to the modulation circuit (300). The first power supply grid (301) connects to an array of switches (310, 312, 314). A single switch, for example switch (310), may also be used. The switches (310, 312, 314) may be formed by single transistors, paired transistors, logic gates, etc. The switches (310, 312, 314) may be the same size, i.e., have the same current carrying capabilities, or different sizes, i.e., have different current carrying capabilities.

The switches (310, 312, 314), when "on," allow charge to be transferred from the first power supply grid (301) to a second power supply grid (351). In other words, the charge from the first power supply grid (301) is transferred to the second power supply grid (351) when the switches (310, 312, 314) are "on." The switches (310, 312, 314), when "off," do not allow charge to be transferred from the first power supply grid (301) to the second power supply grid (351). In other words, the second power supply grid (351) is isolated, i.e., floating.

The digital register (252) maintains a digital value representative of the desired second voltage for the second power supply grid (351). A digital to analog converter (304) converts the N signal lines (253) from the digital register (252) into an analog signal (303). The analog signal (303) is compared by an analog comparator (306) to the second voltage for the second power supply grid (351). The analog comparator (306) is used to determine whether the desired second voltage represented by the digital register (252) matches the second voltage for the second power supply grid (351). The analog comparator (306) may adjust the second voltage on the second power supply grid (351) by changing the frequency and/or duty cycle of the modulation of the switches (310, 312, 314). The analog comparator (306) uses an analog to digital converter (308) to convert the modulation signal from the analog comparator (306) to a digital signal used to turn "on" or "off" the switches (310, 312, 314). Those with ordinary skill in the art will appreciate that the analog comparator (306) and/or analog to digital converter (308) may be arranged to modulate some or all of the switches (310, 312, 314) at different frequencies and/or duty cycles.

Figure 4:
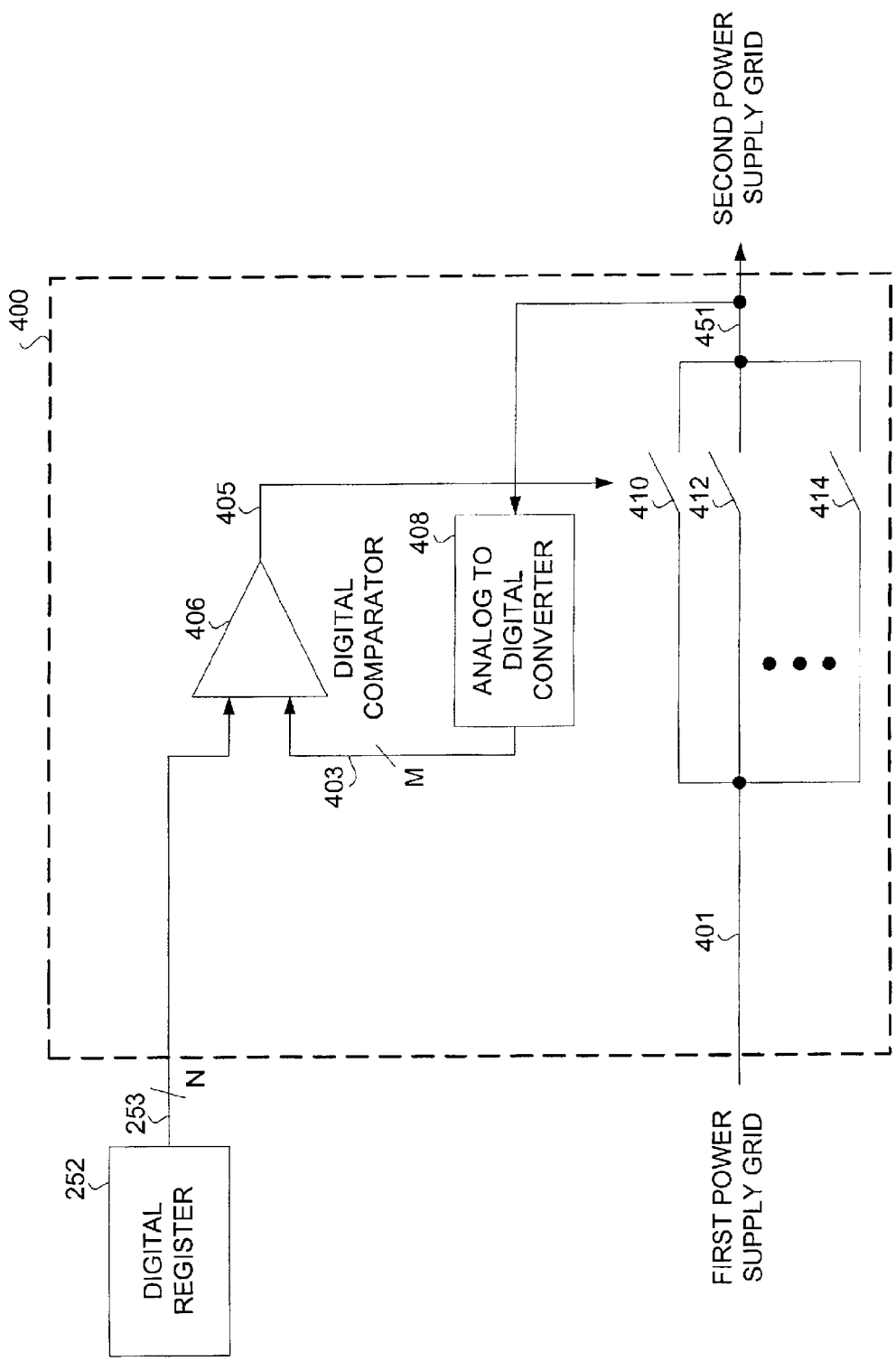
FIG. 4 shows a schematic of the modulation circuit in accordance with an embodiment of the present invention.

FIG. 4 shows a schematic of an exemplary modulation circuit (400) in accordance with an embodiment of the present invention. Modulation circuit (400) may be representative of the modulation circuit (230) in FIG. 2. A first power supply grid (401) is connected to the modulation circuit (400). The first power supply grid (401) connects to an array of switches (410, 412, 414). A single switch, for example switch (410), may also be used. The switches (410, 412, 414) may be formed by single transistors, paired transistors, logic gates, etc. The switches (410, 412, 414) may be the same size, i.e., have the same current carrying capabilities, or different sizes, i.e., have different current carrying capabilities.

The switches (410, 412, 414), when "on," allow charge to be transferred from the first power supply grid (401) to a second power supply grid (451). In other words, the charge from the first power supply grid (401) is transferred to the second power supply grid (451) when the switches (410, 412, 414) are "on." The switches (410, 412, 414), when "off," do not allow charge to be transferred from the first power supply grid (401) to the second power supply grid (451). In other words, the second power supply grid (451) is isolated.

The digital register (252) maintains a digital value representative of the desired second voltage for the second power supply grid (451). Values on the N signal lines (253) from the digital register (252) are input into a digital comparator (406). The values on the N signal lines (253) determine a desired second voltage for the second power supply grid (451). The second voltage for the second power supply grid (451) is converted to a digital word by an analog to digital converter (408). The values on the M signal lines (405) represent the second voltage on the second power supply grid (451). The values on the N signal lines (253) are compared to the values on the M signal lines (405) by digital comparator (406). The digital comparator (406) is used to determine whether the desired second voltage represented by the digital register (252) matches the second voltage for the second power supply grid (451) represented by the values on the M signal lines (405). The digital comparator (406) may adjust the second voltage for the second power supply grid (451) by changing the frequency and/or duty cycle of the modulation of the switches (410, 412, 414). The digital comparator (406) uses signal (405) to modulate the switches (410, 412, 414). Those with ordinary skill in the art would appreciate that the digital comparator (406) may be arranged to modulate some or all of the switches (410, 412, 414) at different frequencies and/or duty cycles.

Advantages of the present invention may include one or more of the following. In some embodiments, because an isolated or floating power supply grid exists, a voltage on the floating power supply grid may be reduced relative to a voltage on a power supply grid connected to an external power supply. Reducing the voltage on the floating power supply grid reduces the power dissipated for circuits connected to the floating power supply grid. A reduction in power is advantageous for the integrated circuit.

In some embodiments, the voltage on the floating power supply grid is reduced through the use of modulated switches. The modulated switches are operatively controlled using a comparator. The comparator determines the frequency and/or duty cycle of the modulation. A comparison between a digital register representative of the desired voltage on the floating power supply grid and the actual voltage on the floating power supply grid may be used to adjust the modulation. The voltage on the floating power supply grid may be adjusted relatively quickly.

In some embodiments, the comparator is arranged as a digital comparator with an accompanying analog to digital converter to allow the comparator to have the proper input signal type. In some embodiments, the comparator is arranged as an analog comparator with an accompanying digital to analog converter to allow the comparator to have the proper input signal type. An analog comparator also uses an analog to digital converter to modulate the switches The modulation circuit may advantageously be designed using an analog or digital comparator.

In some embodiments, the digital register is operatively connected to the modulation circuit to determine a desired voltage on a floating power supply grid. Furthermore, the digital register maintains a value representative of the desired voltage on the floating power supply grid. The desired voltage may be representative of an activity level or an anticipated activity level of a circuit connected to the floating power supply grid. The digital register may be changed in advance of a change in the activity level of the circuit.

In some embodiments, the modulation circuit operates by transferring charge between capacitors. This arrangement does not require a continuous DC current to flow between the two capacitances for proper operation. Also, the higher voltage and possibly higher capacitance for a first power supply grid enables a sufficient and relatively fast means to transfer charge to a floating power supply grid.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a first power supply grid;
   a modulation circuit arranged to receive a first voltage from the first power supply grid, wherein the first voltage is modulated by the modulation circuit to produce a second voltage not greater than the first voltage on a second power supply grid; and
   a digital register operatively connected to the modulation circuit, wherein the digital register determines a desired second voltage of a circuit connected to the second power supply grid and controls the modulation of the modulation circuit.

2. The integrated circuit of claim 1, wherein the digital register is modified prior to a change in the activity level of the circuit.

3. The integrated circuit of claim 1, the modulation circuit comprising a comparator.

4. The integrated circuit of claim 3, wherein the comparator operatively compares the second voltage and a value maintained by the digital register.

5. The integrated circuit of claim 3, wherein the comparator is an analog comparator, the modulation circuit comprising a digital to analog converter interposed between the digital register and the analog comparator.

6. The integrated circuit of claim 3, wherein the comparator is a digital comparator, the modulation circuit comprising an analog to digital converter interposed between the second power supply grid and the digital comparator.

7. The integrated circuit of claim 3, the modulation circuit comprising at least one switch, wherein the at least one switch is operatively controlled by the comparator.

8. The integrated circuit of claim 7, wherein the comparator determines a duty cycle of modulation of the at least one switch.

9. The integrated circuit of claim 7, wherein the comparator determines a frequency of modulation of the at least one switch.

10. The integrated circuit of claim 7, wherein the comparator is an analog comparator, the modulation circuit comprising an analog to digital converter interposed between the analog comparator and the at least one switch.

11. The integrated circuit of claim 1, wherein the modulation circuit transfers charge between at least one capacitor in the first power supply grid and at least one capacitor in the second power supply grid.

12. The integrated circuit of claim 11, wherein the at least one capacitor in the first power supply grid maintains a greater stored charge than the at least one capacitor in the second power supply grid.

13. A method of supplying power to an integrated circuit, comprising:
   modulating a first voltage from a first power supply grid to produce a second voltage not greater than the first voltage on a second power supply grid;
   determining a desired second voltage on the second power supply grid based on an activity level of a circuit connected to the second power supply grid;
   maintaining a digital value representative of the desired second voltage on the second power supply grid; and
   adjusting the desired second voltage based on the digital value.

14. The method of claim 13, wherein the determining the desired second voltage occurs prior to a change in the activity level of the circuit.

15. The method of claim 13, wherein the modulating transfers charge between at least two capacitors.

16. The method of claim 13, modulating the first voltage from the first power supply grid comprising comparing the second voltage and the digital value.

17. The method of claim 16, the comparing the second voltage and the digital value comprising converting the digital value to an analog signal.

18. The method of claim 16, the comparing the second voltage and the digital value comprising converting the second voltage to a digital signal.

19. The method of claim 16, the modulating the first voltage from the first power supply grid to produce the second voltage comprising at least one switch, wherein the modulating modulates the at least one switch.

20. The method of claim 19, wherein the modulating is controlled by the adjusting.

21. The method of claim 19, wherein the adjusting determines a duty cycle of the modulating the at least one switch.

22. The method of claim 19, wherein the adjusting determines a frequency of modulating the at least one switch.

23. An integrated circuit, comprising:

means for modulating a first voltage from a first power supply grid to produce a second voltage not greater than the first voltage on a second power supply grid;

means for determining a desired second voltage on the second power supply grid based on an activity level of a circuit connected to the second power supply grid;

means for maintaining a digital value representative of the activity level of the circuit connected to the second power supply grid; and means for adjusting the desired second voltage based on the digital value.

* * * * *

UNITED STATES PATENT AND TRADEMARK OFFICE
CERTIFICATE OF CORRECTION

PATENT NO. : 6,737,844 B2  
DATED : May 18, 2004  
INVENTOR(S) : Pradeep Trivedi et al.

It is certified that error appears in the above-identified patent and that said Letters Patent is hereby corrected as shown below:

Column 7,  
Lines 64-67, replace "wherein the digital register determines a desired second voltage of a circuit connected to the second power supply grid and controls the modulation of the modulation circuit" with -- wherein, dependent on the digital register, the modulation circuit is arranged to modulate the second voltage by selectively transferring charge between a first capacitor associated with the first power supply grid and a second capacitor associated with the second power supply grid --.

Column 8,  
Line 28, after "comprising", insert -- a digital to analog converter interposed between the digital register and the analog comparator; and --.  
Line 42, after "grid;" insert the following paragraph -- wherein the modulating comprises selectively transferring charge between a first capacitor associated with the first power supply grid and a second capacitor assoicated with the second power supply grid; --.

Signed and Sealed this

Sixteenth Day of November, 2004

JON W. DUDAS  
*Director of the United States Patent and Trademark Office*